(12) United States Patent
Kiritani (10) Patent No.: US 10,063,201 B2
(45) Date of Patent: Aug. 28, 2018

(54) SEMICONDUCTOR INTEGRATED CIRCUIT, VARIABLE GAIN AMPLIFIER, AND SENSING SYSTEM

(71) Applicant: Renesas Electronics Corporation, Tokyo (JP)

(72) Inventor: Masahide Kiritani, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/820,169

(22) Filed: Nov. 21, 2017

(65) Prior Publication Data

US 2018/0097492 A1 Apr. 5, 2018

Related U.S. Application Data

(63) Continuation of application No. 14/865,204, filed on Sep. 25, 2015, now Pat. No. 9,831,842.

(30) Foreign Application Priority Data

Oct. 1, 2014 (JP) ................. 2014-203309

(51) Int. Cl.
*H03F 1/34* (2006.01)
*H03G 3/02* (2006.01)
(Continued)

(52) U.S. Cl.
CPC .............. *H03G 3/02* (2013.01); *H03F 3/08* (2013.01); *H03F 3/45475* (2013.01); *H03F 3/50* (2013.01);
(Continued)

(58) Field of Classification Search
CPC ........................................ H03F 1/34
(Continued)

(56) References Cited

U.S. PATENT DOCUMENTS 6,147,558 A * 11/2000 Sculley .............. H03G 1/0088
330/284
6,693,491 B1 2/2004 Delano
(Continued)

FOREIGN PATENT DOCUMENTS

JP 56-169614 5/1980
JP 58-173921 11/1982
(Continued)

OTHER PUBLICATIONS

United States Notice of Allowance dated Jul. 21, 2017 in U.S. Appl. No. 14/865,204.
(Continued)

*Primary Examiner* — Henry Choe
(74) *Attorney, Agent, or Firm* — McGinn I.P. Law Group, PLLC.

(57) ABSTRACT

A semiconductor integrated circuit includes a first pad provided on one end side of a first resistive element and one end side of a second resistive element externally provided, a second pad provided on a different end side of the first resistive element, a third pad provided on a different end side of the second resistive element and one end side of a third resistive element externally provided, an operation amplifier, a first signal line, wired between an output terminal of the operation amplifier and the first pad, a second signal line wired between an inverting input terminal of the operation amplifier and the second pad, a third signal line wired between the inverting input terminal of the operational amplifier and the third pad, a first ESD protection element, provided to the first signal line, a fourth signal line, through which a voltage signal of the first pad.

8 Claims, 9 Drawing Sheets

(51) Int. Cl.
  *H03F 3/08* (2006.01)
  *H03F 3/45* (2006.01)
  *H03F 3/50* (2006.01)
  *H03G 3/08* (2006.01)

(52) U.S. Cl.
  CPC ..... *H03G 3/08* (2013.01); *H03F 2203/45138* (2013.01); *H03F 2203/45522* (2013.01); *H03F 2203/45528* (2013.01); *H03F 2203/45534* (2013.01); *H03F 2203/45591* (2013.01); *H03F 2203/45601* (2013.01); *H03F 2203/45616* (2013.01)

(58) Field of Classification Search
  USPC .................................................. 330/86, 293
  See application file for complete search history.

(56) References Cited

U.S. PATENT DOCUMENTS

| | | | |
|---|---|---|---|
| 6,908,535 B2 | 6/2005 | Rankin et al. | |
| 7,068,107 B2* | 6/2006 | Wang | H03G 1/0088 330/282 |
| 8,044,718 B2 | 10/2011 | Nicollini | |
| 8,531,239 B2* | 9/2013 | Yamazaki | H03F 3/45475 327/124 |
| 8,981,852 B2 | 3/2015 | Dupuis | |
| 2013/0120060 A1 | 5/2013 | Loeda | |

FOREIGN PATENT DOCUMENTS

| | | |
|---|---|---|
| JP | 2003-008375 A | 1/2003 |
| JP | 2005-538341 A | 12/2005 |

OTHER PUBLICATIONS

United States Final Rejection dated Apr. 6, 2017 in U.S. Appl. No. 14/865,204.
United States Non-Final Rejection dated Dec. 20, 2016 in U.S. Appl. No. 14/865,204.
United States Non-Final Rejection dated Aug. 31, 2016 in U.S. Appl. No. 14/865,204.
Japanese Office Action dated May 8, 2018, in corresponding Japanese Patent Application No. 2014-203309 with an English translation thereof.

* cited by examiner

SEMICONDUCTOR INTEGRATED CIRCUIT, VARIABLE GAIN AMPLIFIER, AND SENSING SYSTEM

CROSS-REFERENCE TO RELATED APPLICATIONS

The present application is a Continuation Application of U.S. patent application Ser. No. 14/865,204, filed on Sep. 28, 2015, which is based on Japanese patent application No. 2014-203309, filed on Oct. 1, 2014, the disclosure of which is incorporated herein in its entirety by reference.

BACKGROUND

The present invention relates to a semiconductor integrated circuit, a variable gain amplifier, and a sensing system. For example, the present invention relates to a semiconductor integrated circuit that is suitable for configuring a high-accuracy variable gain amplifier, a variable gain amplifier, and a sensing system.

In recent years, a high-accuracy variable gain amplifier has been demanded. A related technique is disclosed in Japanese Unexamined Patent Application Publication No. 2003-8375.

A variable gain amplifier disclosed in Japanese Unexamined Patent Application Publication No. 2003-8375 is provided with a gm cell that generates and outputs an output current corresponding to an input signal voltage and a current voltage conversion circuit that converts the output current of the gm cell to a voltage and includes an adjustment means for adjusting a conversion gain. The current voltage conversion circuit includes an operation amplifier and a variable resistor that is connected between an input terminal and an output terminal of the operation amplifier and is capable of setting any resistance value.

SUMMARY

In the variable gain amplifier disclosed in Japanese Unexamined Patent Application Publication No. 2003-8375, it is thought that a plurality of resistive elements that constitute the variable resistor is provided in a semiconductor chip. Therefore, due to unevenness in manufacture of those resistive elements, accuracy of the variable gain amplifier may be lowered.

If the plurality of resistive elements that constitute the variable resistor is provided outside the semiconductor chip, and the resistive elements and the operation amplifier in the semiconductor chip are connected through a pad of the semiconductor chip, there arises a problem in that the accuracy of the variable gain amplifier is lowered due to an influence of a resistive component of an ESD protection element provided to the pad.

The other problems and novel features are revealed by the description of this specification and the attached drawings.

According to an aspect of the present invention, there is provided a semiconductor integrated circuit including a first pad provided on one end side of a first resistive element externally provided, a second pad provided on a different end side of the first resistive element, an operation amplifier, a first signal line wired between an output terminal of the operation amplifier and the first pad, a second signal line wired between one input terminal of the operation amplifier and the second pad, a first ESD protection element provided to the first signal line, and a third signal line, through which a voltage signal of the first pad is transmitted. The third signal line is connected to the first pad.

According to the aspect of the present invention, it is possible to provide a semiconductor integrated circuit capable of forming a high-accuracy variable gain amplifier, the variable gain amplifier, and a sensing system.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Hereinafter, embodiments will be described with reference to the drawings. It should be noted that the drawings are simplified, but the technical range of the embodiments should not be narrowly interpreted on the basis of the drawings. Further, the same constituents are denoted by the same reference numerals or symbols, and overlapped description will be omitted.

In the following embodiments, when necessary, descriptions will be given in a plurality of sections or embodiments in a divided manner for the sake of convenience. Those are associated with each other unless otherwise expressly described, and one is a modification example, an application example, a detailed explanation, a supplementary explanation, or the like of a part or all of the other. Further, in the following embodiments, when a number relating to a constituent (including count, numerical value, amount, range, or the like) is mentioned, there is no limitation on a specific number unless otherwise expressly described and unless otherwise limited to the specific number obviously in principle, for example. The number may be the specific number or more or less.

Further, in the following embodiments, constituents thereof (including operation steps or the like) are not necessarily essential unless otherwise expressly described and except the case where those are obviously essential in principle, for example. Similarly, in the following embodiments, when a shape, a positional relationship, or the like of a constituent or the like is mentioned, the shape, the positional relationship, or the like substantially include a similar shape, relationship, or the like unless otherwise expressly described and except as may be obviously different in principle, for example. The same holds true for the number or the like (including count, numerical value, range, or the like).

First Embodiment

Figure 1:
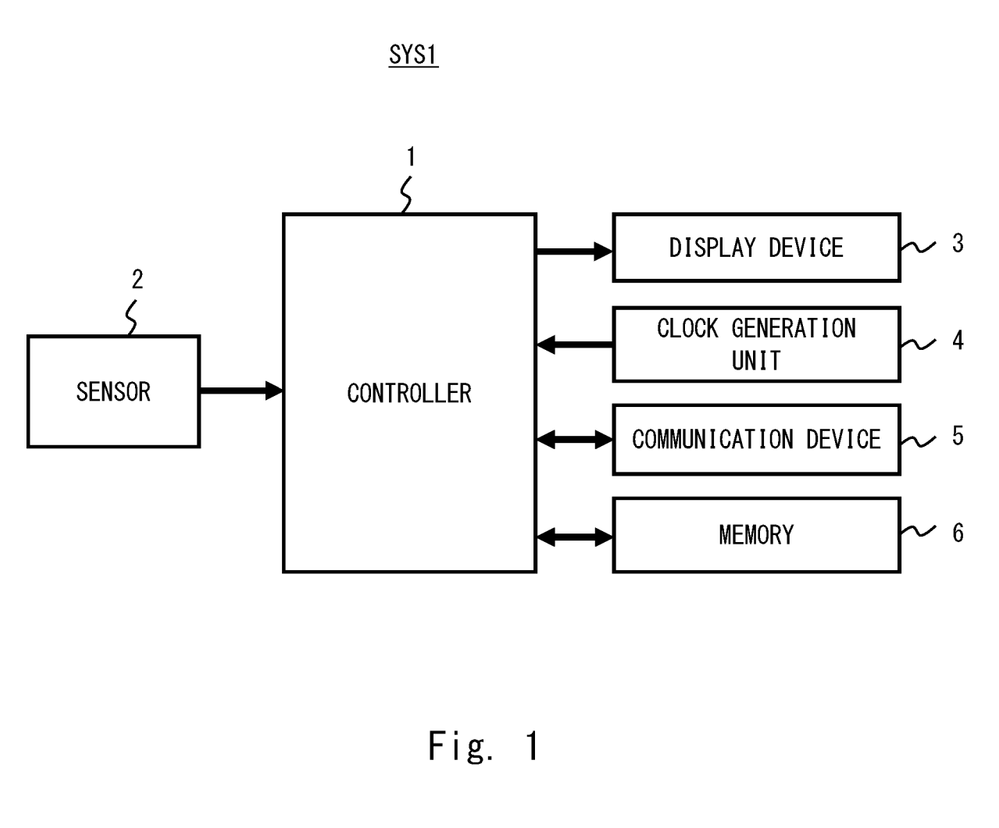
FIG. 1 is a block diagram showing a sensing system on which a variable gain amplifier according to a first embodiment is mounted.

FIG. 1 is a block diagram showing a sensing system SYS1 on which a variable gain amplifier according to a first embodiment is mounted. The sensing system SYS1 is, for example, a blood glucose level measurement system that uses an enzymatic electrode method. A specific description will be given in the following.

As shown in FIG. 1, the sensing system SYS1 is provided with a controller 1, a sensor 2, a display device 3 such as a liquid crystal display (LCD), a clock generation unit 4, a communication device 5 that uses infrared data association (IrDA) or the like, and a memory 6 such as an EEPROM.

The sensor 2 is, for example, a test strip. When a bias voltage is applied to an electrode thereof, the sensor 2 outputs, as a measurement result, a current Iin that is proportional to the level of glucose in blood.

The controller 1 includes an amplifier VA1 to be described later, which applies the bias voltage to the sensor 2 and converts the current Iin as the measurement result of the sensor 2 to a voltage Vo. The controller 1 digitizes the voltage Vo by using an AD converter and performs a predetermined process therefor. For example, the controller 1 causes the memory 6 to store the digitized measurement result with a measurement result that has been obtained, causes the display device 3 to display the results, or transmits the results to another device by using the communication device 5.

Here, in order to obtain the measurement result of the sensor 2 by the controller 1 with high accuracy, the amplifier VA1 is required to be highly accurate. Further, the amplifier VA1 is also required to vary a gain when necessary.

(Structure of Variable Gain Amplifier VA1 According to this Embodiment)

Figure 2:
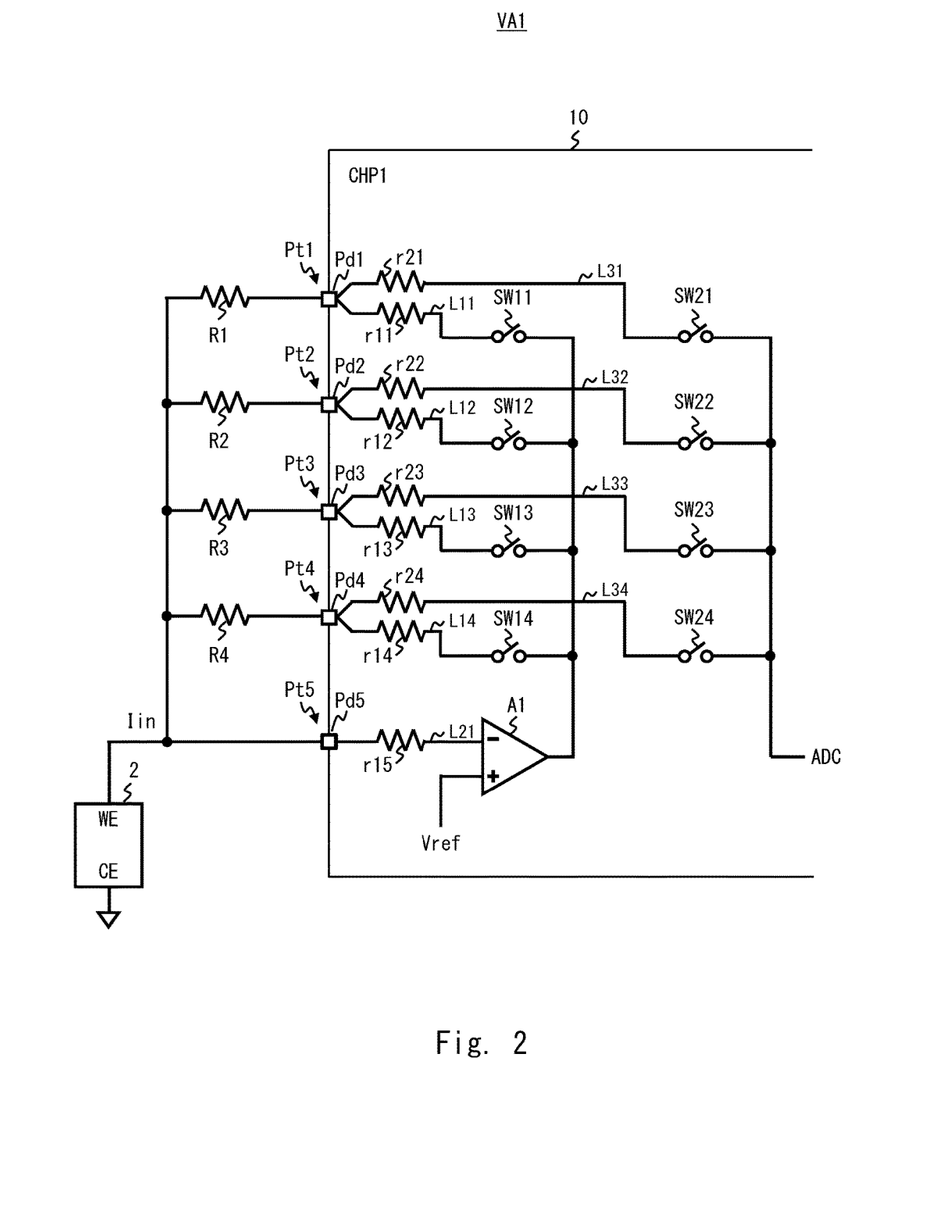
FIG. 2 is a diagram showing a structural example of the variable gain amplifier according to the first embodiment.

FIG. 2 is a diagram showing a structural example of the variable gain amplifier VA1 as a part of the controller 1. It should be noted that the sensor 2 is also shown in FIG. 2.

As shown in FIG. 2, the variable gain amplifier VA1 is so-called an IV amplifier and is constituted of a semiconductor integrated circuit 10 and resistive elements (first resistive elements) R1 to R4. The semiconductor integrated circuit 10 is provided with, on a chip CHP1, at least port units Pt1 to Pt5, an operation amplifier A1, switches (first switches) SW11 to SW14, and switches (second switch) SW21 to SW24. In this case, the resistive elements R1 to R4 are provided outside the chip CHP1. Therefore, the resistive elements R1 to R4 can be exchanged as appropriate in accordance with a specification.

The port unit Pt1 includes a pad Pd1, ESD protection elements r11 and r21, a lead frame, and a connector (not shown) such as a bonding wire. The port unit Pt2 includes a pad Pd2, ESD protection elements r12 and r22, and a connector (not shown) such as a lead frame and a bonding wire. The port unit Pt3 includes a pad Pd3, ESD protection elements r13 and r23, and a connector (not shown) such as a lead frame and a bonding wire. The port unit Pt4 includes a pad Pd4, ESD protection elements r14 and r24, and a connector (not shown) such as a lead frame and a bonding wire. The port unit Pt5 includes a pad Pd5, an ESD protection element r15, and a connector (not shown) such as a lead frame and a bonding wire.

Between an output terminal of the operation amplifier A1 and the pads (first pads) Pd1 to Pd4, a plurality of signal lines (first signal lines) L11 to L14 are wired, respectively. Between an inverting input terminal which is one input terminal of the operation amplifier A1 and the pad (second pad) Pd5, a signal line (second signal line) L21 is wired. To a non-inverting input terminal, which is the other terminal of the operation amplifier A1, a reference voltage Vref is supplied.

The pads Pd1 to Pd4 are provided on one end side of the resistive elements R1 to R4, respectively, outside the chip CHP1, and the pad Pd5 is provided on the other end side of the resistive elements R1 to R4 outside the chip CHP1. More specifically, the pads Pd1 to Pd4 are connected to one ends of the resistive elements R1 to R4, respectively, through the connector such as the lead frame and the bonding wire, and the pad Pd5 is commonly connected to the other end of the resistive elements R1 to R4 through the connector such as the lead frame and the bonding wire. In the following description, unless otherwise noted, representation of the connector such as the lead frame and the bonding wire that connects the pads and the resistive elements will be omitted.

The switches SW11 to SW14 are provided on the signal lines L11 to L14, respectively, and any one of the switches is selectively turned on. It should be noted that the switches SW11 to SW14 each include a resistive component.

For example, in the case where the switch SW11 is turned on, between the inverting input terminal and the output terminal of the operation amplifier A1, a feedback path extending through the resistive element R1 is formed. In the case where the switch SW12 is turned on, a feedback path extending through the resistive element R2 is formed. In the case where the switch SW13 is turned on, a feedback path extending through the resistive element R3 is formed. In the case where the switch SW14 is turned on, a feedback path extending through a resistive element R4 is formed. It should be noted that in this embodiment, the case where the resistive elements R1 to R4 have different resistance values will be described as an example.

The ESD protection elements r11 to r14 are provided on parts of the signal lines L11 to L14 between the pads Pd1 to Pd4 and the switches SW11 to SW14, respectively. The ESD protection element r15 is provided on a part of the signal line L21 between the pad Pd5 and the inverting input terminal of the operation amplifier A1. It should be noted that the ESD protection elements r11 to r15 each include a resistive component.

Further, from the pads Pd1 to Pd4 to a subsequent stage circuit such as the AD converter, signal lines (third signal lines) L31 to L34 are wired, respectively. More specifically, one end of each of the signal lines L31 to L34 is directly connected with the pads Pd1 to Pd4, and the other end of each of the signal lines L31 to L34 is connected to the subsequent stage circuit.

It should be noted that the one end of each of the signal lines L31 to L34 is preferably connected to the pads Pd1 to Pd4 directly through the ESD protection elements, switches, or the like to be described later, but is not limited to this. It is only necessary to be connected to the signal lines between the pads Pd1 to Pd4 and the ESD protection elements r11 to r14.

The switches SW21 to SW24 are provided on the signal lines L31 to L34, respectively, and any one of the switches is selectively turned on. More specifically, the switches SW21 to SW24 are turned on when the switches SW11 to SW14 are turned on, respectively. It should be noted that the switches SW21 to SW24 each include a resistive component.

For example, in the case where the switch SW21 is turned on, there is continuity between the pad Pd1 and the subsequent stage circuit through the signal line L31. In the case where the switch SW22 is turned on, there is continuity between the pad Pd2 and the subsequent stage circuit through the signal line L32. In the case where the switch SW23 is turned on, there is continuity between the pad Pd3 and the subsequent stage circuit through the signal line L33. In the case where the switch SW24 is turned on, there is continuity between the pad Pd4 and the subsequent stage circuit through the signal line L34.

The ESD protection elements r21 to r24 are provided on parts of the signal lines L31 to L34 between the pads Pd1 to Pd4 and the switches SW21 to SW24, respectively. It should be noted that the ESD protection elements r21 to r24 each include a resistive component.

It should be noted that turning on and off of the switches is controlled on the basis of values stored in a register (not shown). Therefore, by adjusting the register values, it is possible to change on and off of the switches.

The current Iin output from the sensor 2 is supplied to the other end side (pad Pd5) of the resistive elements R1 to R4. Then, a voltage signal generated in any one of the pads Pd1 to Pd4 when the current Iin flows into the feedback path selectively formed is transmitted through any one of the signal lines L31 to L34 and supplied to the subsequent stage circuit such as the AD converter.

It should be noted that the subsequent stage circuit is a circuit with a high input impedance preferably. In the case where the input impedance of the subsequent stage circuit is low, it is desirable that a voltage follower circuit is provided immediately before the subsequent stage circuit on the signal lines L31 to L34 extending from the pads Pd1 to Pd4 to the subsequent stage circuit. As a result, the current does not flow in the signal lines L31 to L34 extending from the pads Pd1 to Pd4 to the subsequent stage circuit. Therefore, it is possible to transmit the voltage signal of the pads Pd1 to Pd4 to the subsequent stage circuit without being affected by the resistive components of the ESD protection elements or the like provided on the signal lines L31 to L34. For the input impedance of the subsequent stage circuit, the same consideration is given to the cases in the other embodiments.

(Operation of Variable Gain Amplifier VA1)

Subsequently, the operation of the variable gain amplifier VA1 will be described. In the following, a description will be given on the operation of the variable gain amplifier VA1 in the case where the switches SW11 and SW21 are turned on.

In this example, the switch SW11 is on, so between the inverting input terminal and the output terminal of the operation amplifier A1, the feedback path extending through the resistive element R1 is formed. As a result, into the resistive element R1 formed on the feedback path, the current Iin flows, and thus a potential difference is generated between the both ends of the resistive element R1. As a result, in the pad Pd1 provided on the one end side of the resistive element R1, a voltage signal having a voltage value Vo is generated. The voltage value Vo of the pad Pd1 is substantially the same as or extremely close to a voltage value on one end of the resistive element R1. Further, in this example, the switch SW21 is on, so the voltage signal having the voltage value Vo generated on the pad Pd1 is transmitted through the signal line L31 and supplied to the subsequent stage circuit such as the AD converter.

In this way, the variable gain amplifier VA1 converts the current Iin output from the sensor 2 into the voltage signal having the voltage value Vo and then outputs the signal to the subsequent stage circuit such as the AD converter.

Here, a differential voltage ΔVo between the voltage value Vo of the pad Pd1 and the reference voltage Vref is expressed by the following expression (1). It should be noted that Iin represents a current value of the current Iin, and R1 represents a resistance value of the resistive element R1.

$$\Delta Vo = -Iin \cdot R1 \qquad (1)$$

As can be seen from the expression (1), the voltage value Vo (=ΔVo+Vref) of the pad Pd1 does not depend on the resistive components of the ESD protection element r11 and switch SW11 in the chip CHP1, out of the resistive components on the feedback path, but depends only on the resistance value of the resistive element R1 externally provided. Therefore, the gain of the variable gain amplifier VA1 is not affected by the resistive components of the ESD protection element r11 and the switch SW11 in the chip CHP1 and can be set with high accuracy with the resistance value of the resistive element R1 externally provided.

Similarly, in the case where the switches SW12 and SW22 are turned on, the gain of the variable gain amplifier VA1 is not affected by the resistive components of the ESD protection element r12 and the switch SW12 in the chip CHP1 and can be set with high accuracy with the resistance value of the resistive element R2 externally provided. In the case where the switches SW13 and SW23 are turned on, the gain of the variable gain amplifier VA1 is not affected by the resistive components of the ESD protection element r13 and the switch SW13 in the chip CHP1 and can be set with high accuracy with the resistance value of the resistive element R3 externally provided. In the case where the switches SW14 and SW24 are turned on, the gain of the variable gain amplifier VA1 is not affected by the resistive components of the ESD protection element r14 and the switch SW14 in the chip CHP1 and can be set with high accuracy with the resistance value of the resistive element R4 externally provided.

In this way, the variable gain amplifier VA1 is provided with the resistive elements (R1 and the like) on the feedback paths and outside the chip, and in the chip, provided with the signal lines that extend from the pads (Pd1 and the like) to which the externally provided resistive elements are connected, in addition to the feedback paths. As a result, it is possible to set the gain of the variable gain amplifier VA1 with high accuracy with the resistance values of the resistive elements provided outside the chip without being affected by the resistive components of the ESD protection element and the like in the chip.

In other words, the semiconductor integrated circuit 10 is provided with the signal lines (L31 and the like) that extend from the pads (Pd1 and the like) connected to the resistive elements (R1 and the like) provided on the feedback paths and outside the chip, in addition to the feedback paths. As a result, it is possible to set the gain of the variable gain amplifier VA1 with high accuracy with the resistance values of the resistive elements provided on the feedback paths and outside the chip without being affected by the resistive components of the ESD protection element and the like provided on the feedback paths and in the chip. That is, the semiconductor integrated circuit 10 is capable of forming the high-accuracy variable gain amplifier VA1.

It should be noted that the resistive elements that determine the gain of the variable gain amplifier VA1 are provided outside the chip, so a problem of unevenness in manufacture caused by providing the elements in the chip does not arise.

In this embodiment, the description is given by using the case where the four feedback paths are provided as an example. However, the number of feedback paths is not limited to this. It is possible to change the structure to include any number of feedback paths as appropriate.

The resistive elements R1 to R4 only have to each include the resistive component, and may be for example, switched capacitors.

(Modification Example of Variable Gain Amplifier VA1)

Figure 3:
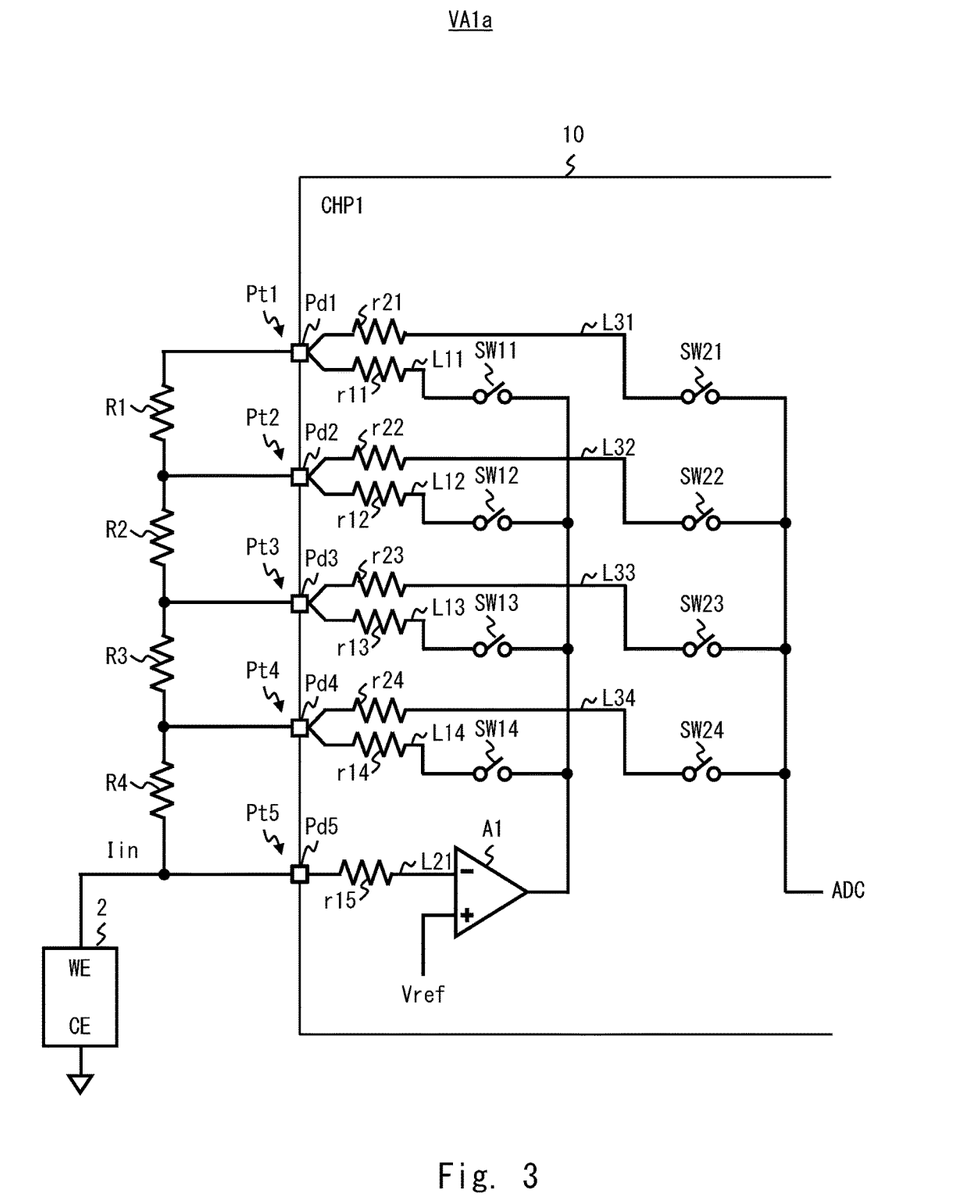
FIG. 3 is a diagram showing a modification example of the variable gain amplifier according to the first embodiment.

FIG. 3 is a diagram showing a modification example of the variable gain amplifier VA1 as a variable gain amplifier VA1a.

As shown in FIG. 3, while in the variable gain amplifier VA1, the resistive elements R1 to R4 are connected in parallel to one another, in the variable gain amplifier VA1a, the resistive elements R1 to R4 are connected in series.

Specifically, the pad Pd1 is connected to one end of the resistive element R1. The pad Pd2 is connected to a node between the other end of the resistive element R1 and one end of the resistive element R2. The pad Pd3 is connected to a node between the other end of the resistive element R2 and one end of the resistive element R3. The pad Pd4 is connected to a node between the other end of the resistive element R3 and one end of the resistive element R4. Further, the pad Pd5 is connected to the other end of the resistive element R4 (on the other end side of the resistive elements R1 to R4).

The other structure of the variable gain amplifier VA1a is the same as the variable gain amplifier VA1, so a description thereof will be omitted.

The variable gain amplifier VA1a is capable of exerting the same effect as the variable gain amplifier VA1.

Second Embodiment

Figure 4:
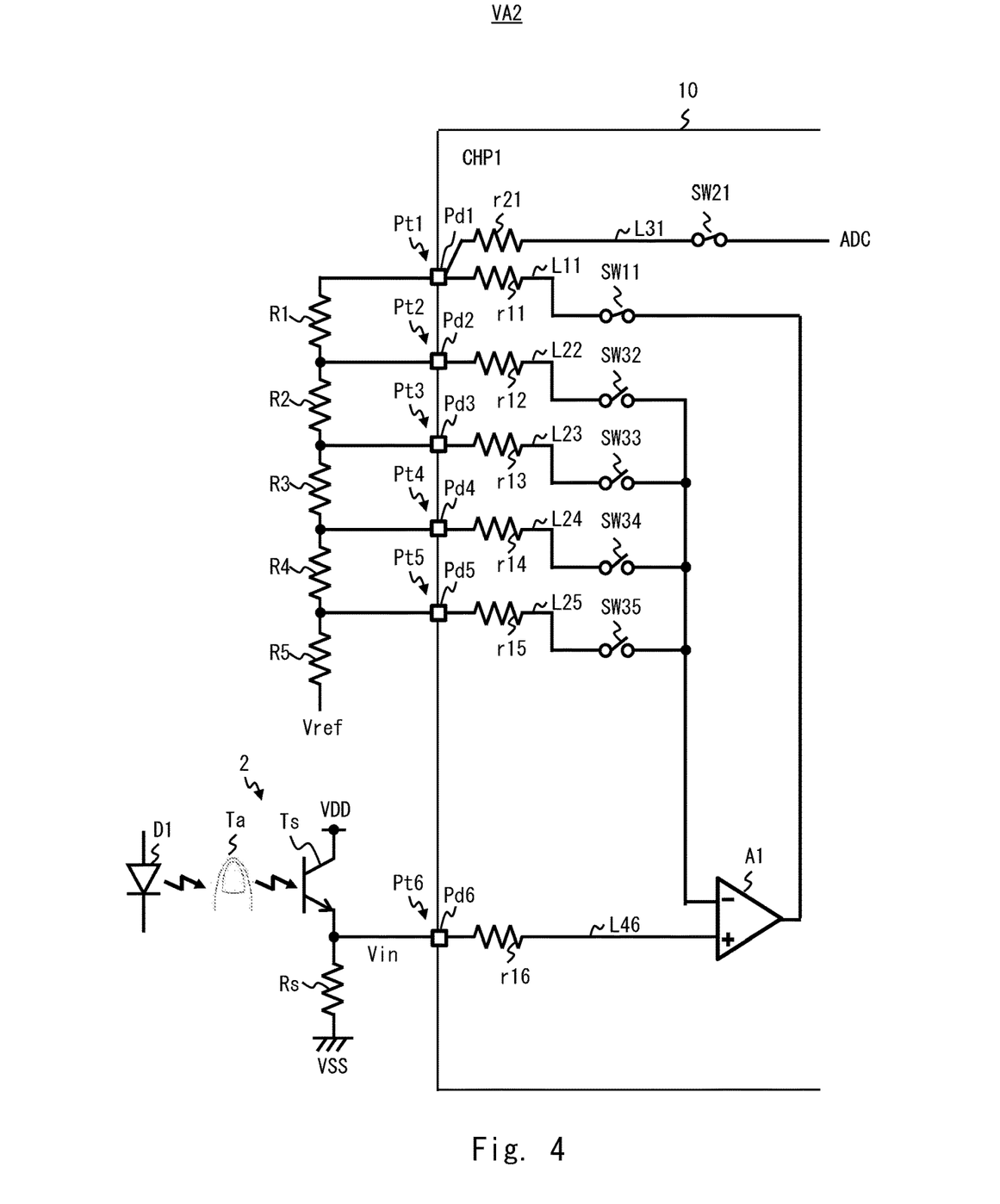
FIG. 4 is a diagram showing a structural example of the variable gain amplifier according to a second embodiment.

FIG. 4 is a diagram showing a structural example of a variable gain amplifier VA2 according to a second embodiment. It should be noted that in FIG. 4, the sensor 2 is also shown.

For example, the variable gain amplifier VA2 is mounted on a measurement system (sensing system) such as a pulse oximeter that measures a pulse and a blood oxygen level.

As shown in FIG. 4, the sensor 2 is constituted of, for example, a phototransistor Ts, a resistive element Rs, and a light emitting diode D1. In response to the pulse and the blood oxygen level of an examination target Ta such as a finger inserted between the light emitting diode D1 and the phototransistor Ts, the intensity of light transmitted to the phototransistor Ts from the light emitting diode D1 through the examination target Ta varies. The phototransistor Ts causes a current corresponding to the intensity of the received light to flow into the resistive element Rs. The resistive element Rs converts the current into a voltage Vin and outputs the voltage as a measurement result. In brief, the sensor 2 outputs the voltage Vin corresponding to the pulse and the blood oxygen level as the measurement result.

The variable gain amplifier VA2 is so-called a non-inverting amplifier and is constituted of the semiconductor integrated circuit 10 and the resistive elements R1 to R5. The semiconductor integrated circuit 10 is provided with, on the chip CHP1, at least the port units Pt1 to Pt6, the operation amplifier A1, the switch (first switch) SW11, the switch (second switch) SW2l, and switches (third switches) SW32 to SW35. In this case, the resistive elements (first resistive elements) R1 to R4 and the resistive element (second resistive element) R5 are provided outside the chip CHP1. Therefore, the resistive elements R1 to R5 can be exchanged as appropriate in accordance with a specification thereof.

The port unit Pt1 includes the pad Pd1, the ESD protection elements r11 and r21, and the connector (not shown) such as the lead frame and the bonding wire. The port unit Pt2 includes the pad Pd2, the ESD protection element r12, and the connector (not shown) such as the lead frame and the bonding wire. The port unit Pt3 includes the pad Pd3, the ESD protection element r13, and the connector (not shown) such as the lead frame and the bonding wire. The port unit Pt4 includes the pad Pd4, the ESD protection element r14, and the connector (not shown) such as the lead frame and the bonding wire. The port unit Pt5 includes the pad Pd5, the ESD protection element r15, and the connector (not shown) such as the lead frame and the bonding wire.

Between the output terminal of the operation amplifier A1 and the pad (first pad) Pd1, the signal line (first signal line) L11 is wired. Between the inverting input terminal as one input terminal of the operation amplifier A1 and the pads (second pads) Pd2 to Pd5, a plurality of signal lines (second signal lines) L22 to L25 are wired, respectively. Between the non-inverting input terminal as the other input terminal of the operation amplifier A1 and a pad Pd6, a signal line (fourth signal line) L46 is wired.

The pad Pd1 is connected to one end of the resistive element R1 (on one end side of the resistive elements R1 to R4). The pad Pd2 is connected to a node between the other end of the resistive element R1 and one end of the resistive element R2. The pad Pd3 is connected to a node between the other end of the resistive element R2 and one end of the resistive element R3. The pad Pd4 is connected to a node between the other end of the resistive element R3 and one end of the resistive element R4. The pad Pd5 is connected to a node between the other end of the resistive element R4 and one end of the resistive element R5. To the other end of the resistive element R5, the reference voltage Vref is supplied.

The switches SW32 to SW35 are provided on the signal lines L22 to L25, respectively, and any one of the switches is selectively turned on. The switch SW11 is provided on the signal line L11 and is always on. Therefore, the switch SW11 may be omitted. It should be noted that the switches SW11, and SW32 to SW35 each include a resistive component.

For example, between the inverting input terminal and the output terminal of the operation amplifier A1, in the case where the switch SW32 is turned on, a feedback path extending through the resistive element R1 is formed. In the case where the switch SW33 is turned on, a feedback path extending through the resistive elements R1 and R2 is formed. In the case where the switch SW34 is turned on, a feedback path extending through the resistive elements R1 to R3 is formed. In the case where the switch SW35 is turned on, a feedback path extending through the resistive elements R1 to R4 is formed.

The ESD protection element r11 is provided on a part of the signal line L11 between the pad Pd1 and the switch SW11. The ESD protection elements r12 to r15 are provided on parts of the signal lines L22 to L25 between the pads Pd2 to Pd5 and the switches SW32 to SW35, respectively. The ESD protection element r16 is provided on a part of the signal line L46 between the pad Pd6 and the non-inverting input terminal of the operation amplifier A1. It should be noted that the ESD protection elements r11 to r16 each include a resistive component.

Further, from the pad Pd1 to the subsequent stage circuit such as the AD converter, the signal line (third signal line) L31 is wired. More specifically, one end of the signal line L31 is directly connected to the pad Pd1, and the other end of the signal line L31 is connected to the subsequent stage circuit. It should be noted that the one end of the signal line L31 is desirably connected to the pad Pd1 directly through the ESD protection element, the switch, or the like to be described later, but is not limited to this, and it is only necessary to be connected to at least the signal line between the pad Pd1 and the ESD protection element r11.

The switch SW21 is provided on the signal line L31 and is always on. Therefore, the switch SW21 may be omitted. It should be noted that the switch SW21 includes a resistive component.

The ESD protection element r21 is provided on a part of the signal line L31 between the pad Pd1 and the switch SW2l. It should be noted that ESD protection element r21 includes a resistive component.

It should be noted that turning on and off of the switches is controlled on the basis of values stored in a register (not shown). Therefore, by adjusting the values stored in the register, it is possible to switch on and off of the switches.

The voltage Vin output from the sensor 2 is supplied to the non-inverting input terminal of the operation amplifier A1 through the pad Pd6. A voltage signal (result of amplification of voltage Vin) of the voltage value Vo, which is generated on the pad Pd1 when the voltage Vin is supplied thereto, is transmitted through the signal line L31 and supplied to the subsequent stage circuit such as the AD converter.

It should be noted that the subsequent stage circuit is a circuit with a high input impedance desirably. In the case where the input impedance of the subsequent stage circuit is low, it is desirable that a voltage follower circuit is provided on the signal line L31 extended from the pad Pd1 to the subsequent stage circuit.

(Operation of Variable Gain Amplifier VA2)

Subsequently, the operation of the variable gain amplifier VA2. Hereinafter, a description will be given on the operation of the variable gain amplifier VA2 in the case where the switch SW32 is turned on. It should be noted that the switches SW11 and SW21 are always on as described above.

In this example, because the switch SW32 is on, between the inverting input terminal and the output terminal of the operation amplifier A1, the feedback path extending through resistive element R1 is formed. As a result, on the pad Pd1 provided on the feedback path, generated is a voltage signal of the voltage value Vo, which is obtained by amplifying the voltage Vin with a gain determined by the resistive element R1 as a feedback resistor and the resistive elements R2 to R5. The voltage value Vo of the pad Pd1 is substantially the same as or extremely close to a voltage value on one end of the resistive element R1. Then, the voltage signal of the voltage value Vo generated on the pad Pd1 is transmitted through the signal line L31 and supplied to the subsequent stage circuit of the AD converter.

Here, a differential voltage ΔVo between the voltage value Vo of the pad Pd1 and the reference voltage Vref is expressed by the following expression (2). It should be noted that ΔVin represents a differential voltage between the voltage Vin and the reference voltage Vref, R1 represents a resistance value of the resistive element R1, and R25 represents a total resistance value of the resistive elements R2 to R5.

$$\Delta Vo = (1 + R1/R25) \cdot \Delta Vin \qquad (2)$$

As can be seen from the expression (2), the voltage value Vo of the pad Pd1 does not depend on the resistive components of the ESD protection element r11 and switch SW11 in the chip CHP1, out of the resistive components on the feedback paths, and depends only on resistance values of the resistive elements R1 to R5 externally provided. Therefore, a gain of the variable gain amplifier VA2 is not affected by the resistive components of the ESD protection element r11 and switch SW11 in the chip CHP1 and can be set with high accuracy with the resistance values of the resistive elements R1 to R5 externally provided.

Similarly, in the case where the any one of the switches SW33 to SW35 is turned on, the gain of the variable gain amplifier VA2 can be set with high accuracy with the resistance values of the resistive elements R1 to R5 externally provided without being affected by resistive component of the ESD protection element or the like in the chip CHP1.

As described above, the variable gain amplifier VA2 is provided with the resistive elements (R1 and the like) on the feedback paths and outside the chip and provided with, in the chip, the signal lines that extend from the pads (Pd1 and the like) to which the resistive elements externally provided are connected, in addition to the feedback paths. As a result, without being affected by the resistive components such as the ESD protection element and the like provided in the chip, the gain of the variable gain amplifier VA2 can be set with high accuracy with the resistance values of the resistive elements provided outside the chip.

In other words, the semiconductor integrated circuit 10 is provided with, in addition to the feedback paths, the signal lines (L31 and the like) that extend from the pads (Pd1 and the like) connected to the resistive elements (R1 and the like) provided on the feedback paths and outside the chip. As a result, without being affected by the resistive component such as the ESD protection element or the like provided on the feedback path and in the chip, the gain of the variable gain amplifier VA2 can be set with high accuracy with the resistance values of the resistive elements provided on the feedback paths and outside the chip. That is, the semiconductor integrated circuit 10 is capable of forming the high-accuracy variable gain amplifier VA2.

It should be noted that the resistive elements that determine the gain of the variable gain amplifier VA2 are provided outside the chip, so a problem of unevenness in manufacture due to providing the elements in the chip does not arise.

In this embodiment, the case where the four feedback paths are provided is described as an example. However, the number of feedback paths is not limited to this and can be changed as appropriate.

The resistive elements R1 to R5 only have to have the resistive components and may be switched capacitors, for example.

(Modification Example of Variable Gain Amplifier VA2)

Figure 5:
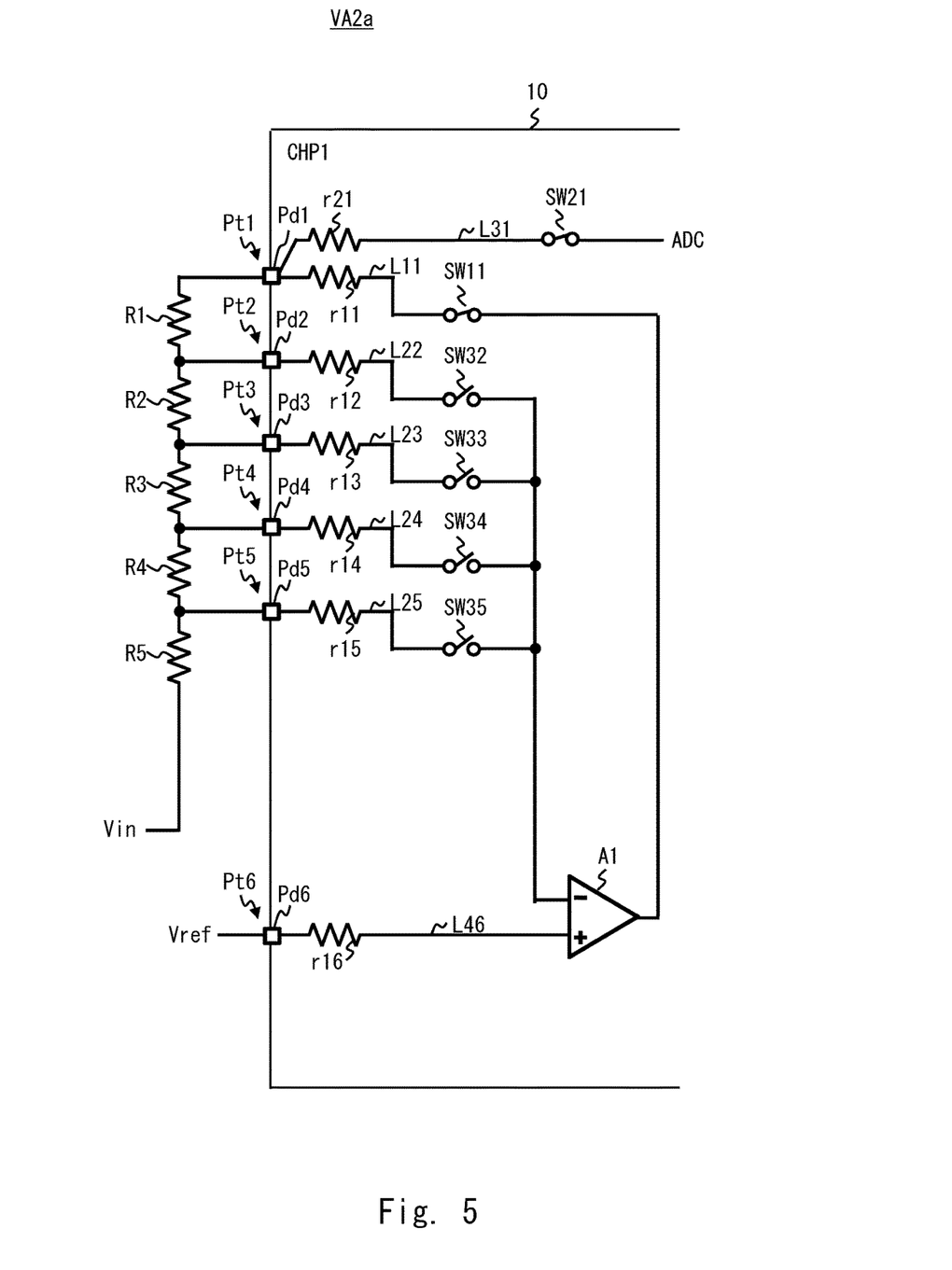
FIG. 5 is a diagram showing a modification example of the variable gain amplifier according to the second embodiment.

FIG. 5 is a diagram showing a modification example of the variable gain amplifier VA2 as a variable gain amplifier VA2a.

As shown in FIG. 5, the variable gain amplifier VA2a is different from the variable gain amplifier VA2 in that the supply destinations of the voltage Vin and the reference voltage Vref are reversed. The other structure of the variable gain amplifier VA2a is the same as the variable gain amplifier VA2, so a description thereof will be omitted.

The variable gain amplifier VA2a is so-called an inverting amplifier and can basically exert the same effect as the variable gain amplifier VA2.

Third Embodiment

In this embodiment, a description will be given on a specific structure of the semiconductor integrated circuit 10 applied to the variable gain amplifiers VA1 and VA2.

Figure 6:
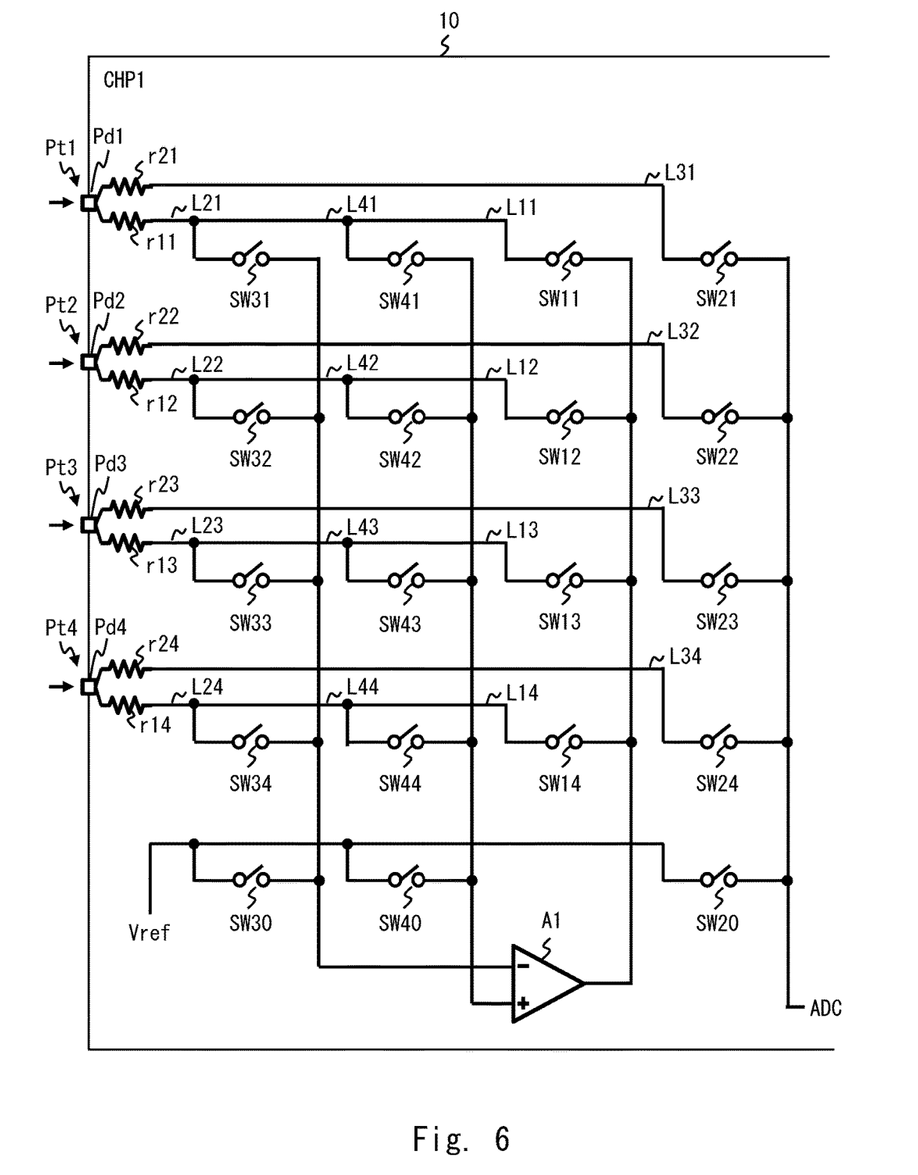
FIG. 6 is a diagram showing a structural example of a semiconductor integrated circuit according to a third embodiment.

FIG. 6 is a diagram showing a specific structural example of the semiconductor integrated circuit 10 according to a third embodiment.

As shown in FIG. 6, the semiconductor integrated circuit 10 has a configurable structure and is provided with, on the chip CHP1, the port units Pt1 to Pt4, the operation amplifier A1, the plurality of switches SW11 to SW14, a switch SW20, the switches SW21 to SW24, switches SW30 and SW31, the switches SW32 to SW34, and the switches SW40 to SW44. The port units Pt1 to Pt4 are as described above.

Between the output terminal of the operation amplifier A1 and the pads Pd1 to Pd4, the signal lines (first signal lines) L11 to L14 are wired, respectively. On the signal lines L11 to L14, the switches (first switches) SW11 to SW14 are provided, respectively.

Between the inverting input terminal of the operation amplifier A1 and the pads Pd1 to Pd4, the signal lines (second signal lines) L21 to L24 are wired, respectively. On the signal lines L21 to L24, the switches (third switches) SW31 to SW34 are provided, respectively. Further, on the signal line wired between a terminal to which the reference voltage Vref is supplied and the inverting input terminal of the operation amplifier A1, the switch SW30 is provided.

Between the non-inverting input terminal of the operation amplifier A1 and the pads Pd1 to Pd4, signal lines (fourth signal lines) L41 to L44 are wired, respectively. On the signal lines L41 to L44, the switches (fourth switches) SW41 to SW44 are provided, respectively. Further, on the signal line wired between the terminal to which the reference voltage Vref is supplied and the non-inverting input terminal of the operation amplifier A1, the switch SW40 is provided.

Further, from the pads Pd1 to Pd4 to the subsequent stage circuit such as the AD converter, the signal lines (third signal lines) L31 to L34 are wired, respectively. On the signal lines L31 to L34, the switches (second switches) SW21 to SW24 are provided, respectively. In addition, on the signal line wired between the terminal to which the reference voltage Vref is supplied and the subsequent stage circuit, the switch SW20 is provided.

It should be noted that on and off of the switches are controlled on the basis of values stored in a register (not shown). Therefore, by adjusting the values of the register, it is possible to switch on and off of the switches.

The semiconductor integrated circuit 10 changes on and off of the switches, thereby making it possible to form the variable gain amplifier VA1 or VA2 or the like with the resistive elements externally provided.

In this embodiment, the case where the four port units and the plurality of switches corresponding to those are provided is described as an example, but the structure is not limited to this. The structure can be changed as appropriate to include any number of port units and switches corresponding to those.

Subsequently, an application example of the semiconductor integrated circuit 10 will be described.

(First Application Example of Semiconductor Integrated Circuit 10)

Figure 7:
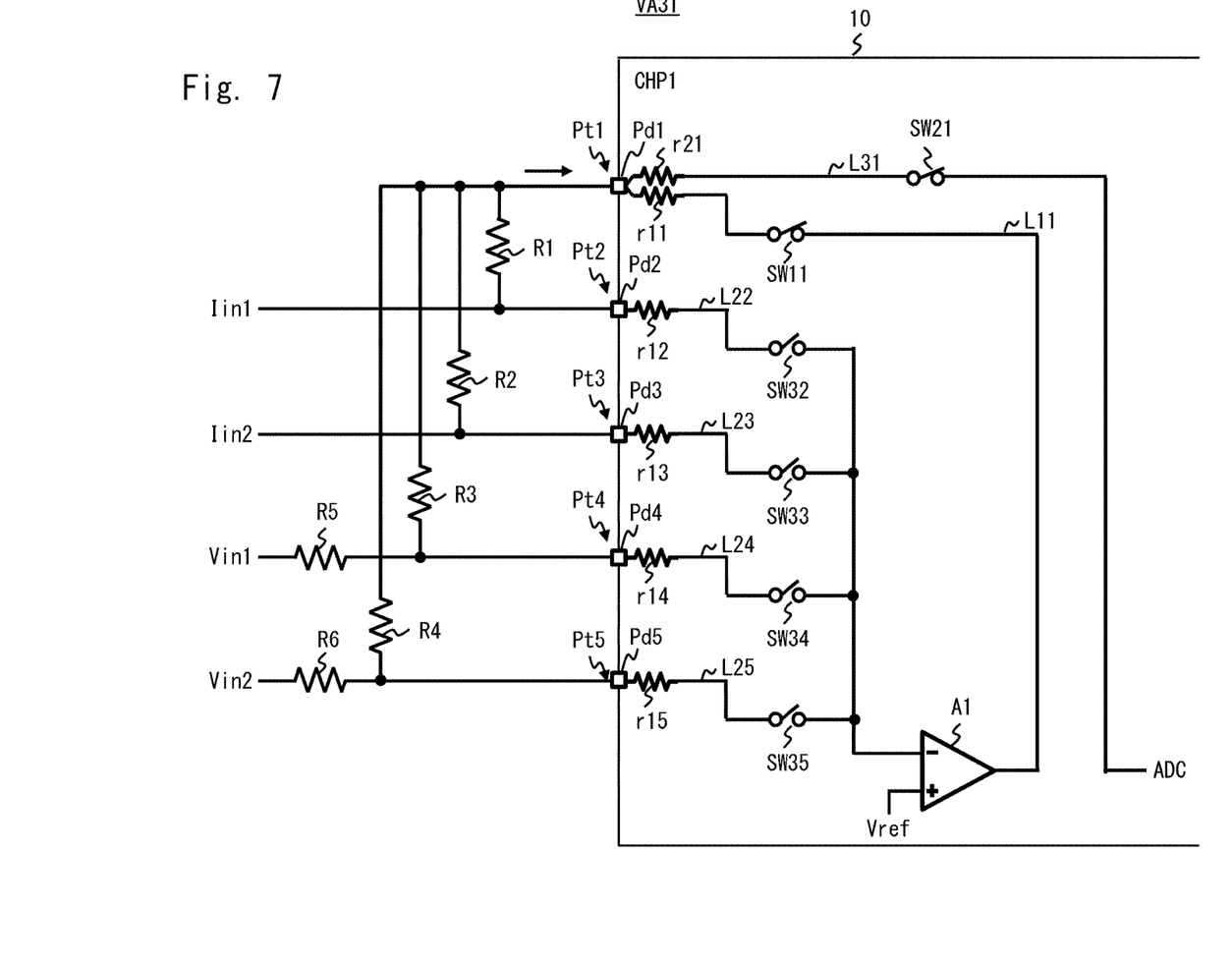
FIG. 7 is a diagram showing a structural example of a variable gain amplifier to which the semiconductor integrated circuit according to the third embodiment is applied.

FIG. 7 is a diagram showing a structural example of a variable gain amplifier VA31 to which the semiconductor integrated circuit 10 is applied. It should be noted that in FIG. 7, a port unit, a switch, and a signal line which are not used are omitted as appropriate.

As shown in FIG. 7, the variable gain amplifier VA31 has the structure in which an IV amplifier and an inverting amplifier can be selectively used, and is constituted of the resistive elements R1 to R5 and a resistive element R6 that are externally provided and the semiconductor integrated circuit 10.

The switches SW11 and SW21 are always on. Any one of the switches SW32 to SW35 is selectively turned on. Therefore, a conduction state is always established between the output terminal of the operation amplifier A1 and the pad Pd1. Between the pad Pd1 and the subsequent stage circuit, a conduction state is always established through a path different from the feedback path. Between the inverting input terminal of the operation amplifier A1 and any one of the pads Pd2 to Pd5, a conduction state is selectively established. Further, to the non-inverting input terminal of the operation amplifier A1, the reference voltage Vref is supplied.

The pad Pd1 is connected to one end of each of the resistive elements R1 to R4. The pad Pd2 is connected to the other end of the resistive element R1. It should be noted that, to the other end of the resistive element R1, a current Iin1 is supplied. The pad Pd3 is connected to the other end of the resistive element R2. It should be noted that, to the other end of the resistive element R2, a current Iin2 is supplied. The pad Pd4 is connected to the other end of the resistive element R3 and one end of the resistive element R5. It should be noted that, to the other end of the resistive element R5, a voltage Vin1 is supplied. The pad Pd5 is connected to the other end of the resistive element R4 and one end of the resistive element R6. It should be noted that, to the other end of the resistive element R6, a voltage Vin2 is supplied.

In the following description, $\Delta Vo$ represents a differential voltage between the voltage value Vo of the pad Pd1 and the reference voltage Vref, $\Delta Vin1$ represents a differential voltage between the voltage Vin1 and the reference voltage Vref, and $\Delta Vin2$ represents a differential voltage between the voltage Vin2 and the reference voltage Vref.

For example, when the switch SW32 is turned on, between the inverting input terminal and the output terminal of the operation amplifier A1, the feedback path extending through the resistive element R1 is formed. In this case, in the pad Pd1, a voltage signal having the voltage value Vo which satisfies $\Delta Vo = -Iin1 \cdot R1$ is generated. Then, the voltage signal generated in the pad Pd1 is transmitted through the signal line L31 and supplied to the subsequent stage circuit such as the AD converter.

In addition, for example, when the switch SW33 is turned on, between the inverting input terminal and the output terminal of the operation amplifier A1, the feedback path extending through the resistive element R2 is formed. In this case, in the pad Pd1, a voltage signal having the voltage value Vo which satisfies $\Delta Vo = -Iin2 \cdot R2$ is generated. Then, the voltage signal generated in the pad Pd1 is transmitted through the signal line L31 and supplied to the subsequent stage circuit such as the AD converter.

In addition, for example, when the switch SW34 is turned on, between the inverting input terminal and the output terminal of the operation amplifier A1, the feedback path extending through the resistive element R3 is formed. In this case, in the pad Pd1, a voltage signal having the voltage value Vo which satisfies $\Delta Vo = -(R3/R5) \cdot \Delta Vin1$ is generated.

Then, the voltage signal generated in the pad Pd1 is transmitted through the signal line L31 and supplied to the subsequent stage circuit such as the AD converter.

In addition, for example, when the switch SW35 is turned on, between the inverting input terminal and the output terminal of the operation amplifier A1, the feedback path extending through the resistive element R4 is formed. In this case, in the pad Pd1, a voltage signal having the voltage value Vo which satisfies $\Delta Vo=-(R4/R6)\cdot\Delta Vin2$ is generated. Then, the voltage signal generated in the pad Pd1 is transmitted through the signal line L31 and supplied to the subsequent stage circuit such as the AD converter.

That is, the variable gain amplifier VA31 operates as the IV amplifier, in the case where either one of the switches SW32 and SW33 is turned on, and operates as the inverting amplifier, in the case where either one of the switches SW34 and SW35 is turned on.

(Second Application Example of Semiconductor Integrated Circuit 10)

Figure 8:
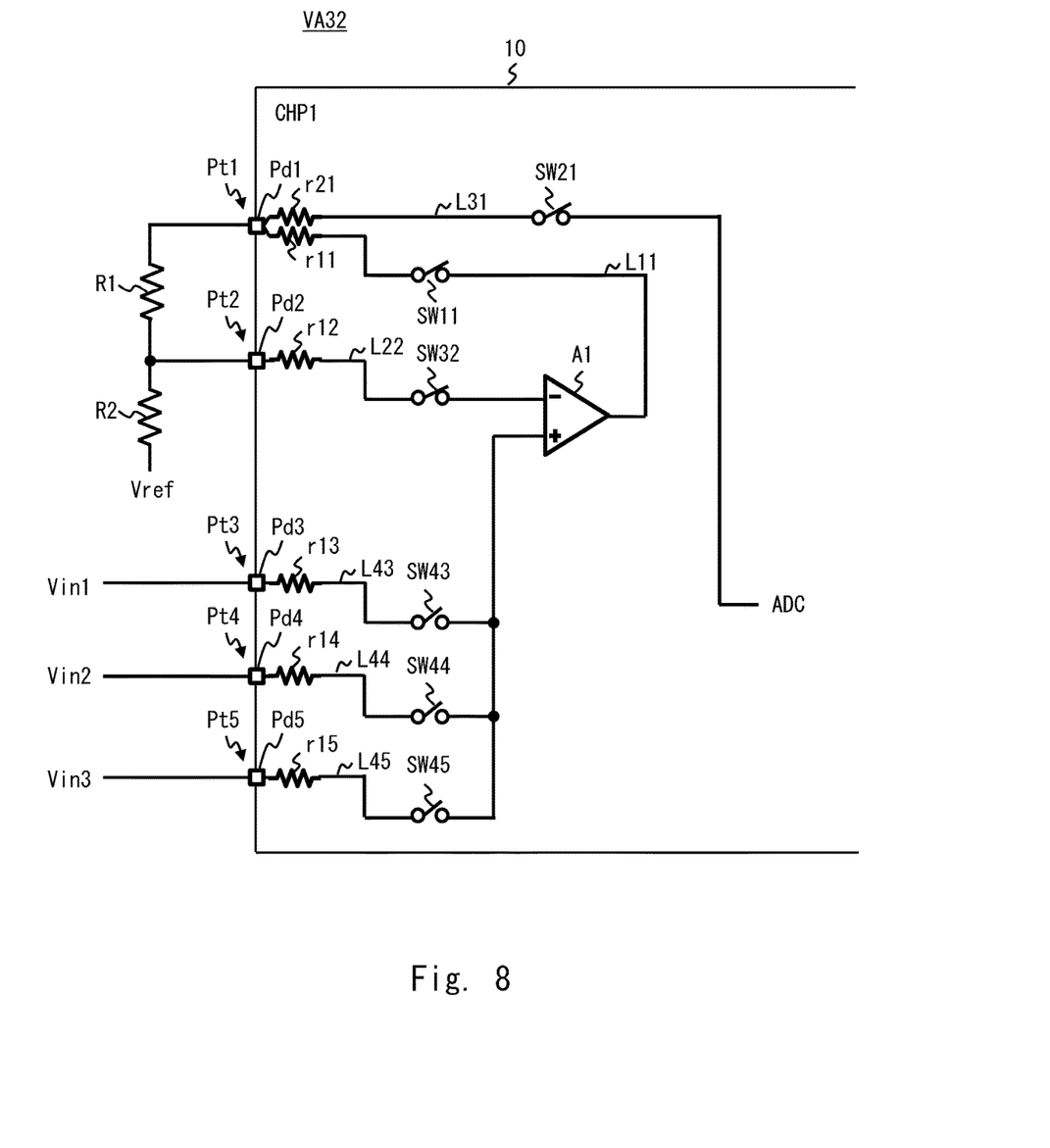
FIG. 8 is a diagram showing a structural example of a variable gain amplifier to which the semiconductor integrated circuit according to the third embodiment is applied.

FIG. 8 is a diagram showing a structural example of a variable gain amplifier VA32 to which the semiconductor integrated circuit 10 is applied. It should be noted that in FIG. 8, a port unit, a switch, and a signal line which are not used are omitted as appropriate.

As shown in FIG. 8, the variable gain amplifier VA32 is a non-inverting amplifier that selectively amplifies any one of the plurality of input voltages Vin1 to Vin3 and is constituted of the resistive elements R1 and R2 externally provided and the semiconductor integrated circuit 10.

The switches SW11, SW21, and SW32 are always on. One of the switches SW43 to SW45 is selectively turned on. Therefore, a conduction state is always established between the output terminal of the operation amplifier A1 and the pad Pd1. Between the pad Pd1 and the subsequent stage circuit, a conduction state is always established through a path different from the feedback path. Between the inverting input terminal of the operation amplifier A1 and the pad Pd2, a conduction state is always established. Between the non-inverting input terminal of the operation amplifier A1 and any one of the pads Pd3 to Pd5, a conduction state is selectively established.

The pad Pd1 is connected to one end of the resistive element R1. The pad Pd2 is connected to the other end of the resistive element R1 and one end of the resistive element R2. To the other end of the resistive element R2, the reference voltage Vref is supplied.

That is, between the output terminal of the operation amplifier A1 and inverting input terminal, the feedback path extending through the resistive element R1 is formed.

In the following description, $\Delta Vo$ represents a differential voltage between the voltage value Vo of the pad Pd1 and the reference voltage Vref, $\Delta Vin1$ represents a differential voltage between the voltage Vin1 and the reference voltage Vref, $\Delta Vin2$ represents a differential voltage between the voltage Vin2 and the reference voltage Vref, and $\Delta Vin3$ represents a differential voltage between the voltage Vin3 and the reference voltage Vref.

For example, in the case where the switch SW43 is turned on, to the non-inverting input terminal of the operation amplifier A1, the voltage Vin1 is supplied. In this case, in the pad Pd1, a voltage signal having the voltage value Vo which satisfies $\Delta Vo=(1+R1/R2)\cdot\Delta Vin1$ is generated. Then, the voltage signal generated in the pad Pd1 is transmitted through the signal line L31 and supplied to the subsequent stage circuit such as the AD converter.

In addition, for example, in the case where the switch SW44 is turned on, to the non-inverting input terminal of the operation amplifier A1, the voltage Vin2 is supplied. In this case, in the pad Pd1, a voltage signal having the voltage value Vo which satisfies $\Delta Vo=(1+R1/R2)\cdot\Delta Vin2$ is generated. Then, the voltage signal generated in the pad Pd1 is transmitted through the signal line L31 and supplied to the subsequent stage circuit such as the AD converter.

Further, for example, in the case where the switch SW45 is turned on, to the non-inverting input terminal of the operation amplifier A1, the voltage Vin3 is supplied. In this case, in the pad Pd1, a voltage signal having the voltage value Vo which satisfies $\Delta Vo=(1+R1/R2)\cdot\Delta Vin3$ is generated. Then, the voltage signal generated in the pad Pd1 is transmitted through the signal line L31 and supplied to the subsequent stage circuit such as the AD converter.

As described above, the variable gain amplifier VA32 operates as the non-inverting amplifier that selectively amplifies any one of the plurality of input voltages Vin1 to Vin3.

The semiconductor integrated circuit 10 can constitute various variable gain amplifiers with the resistive elements externally provided, in addition to the variable gain amplifiers VA31 and VA32.

Fourth Embodiment

Figure 9:
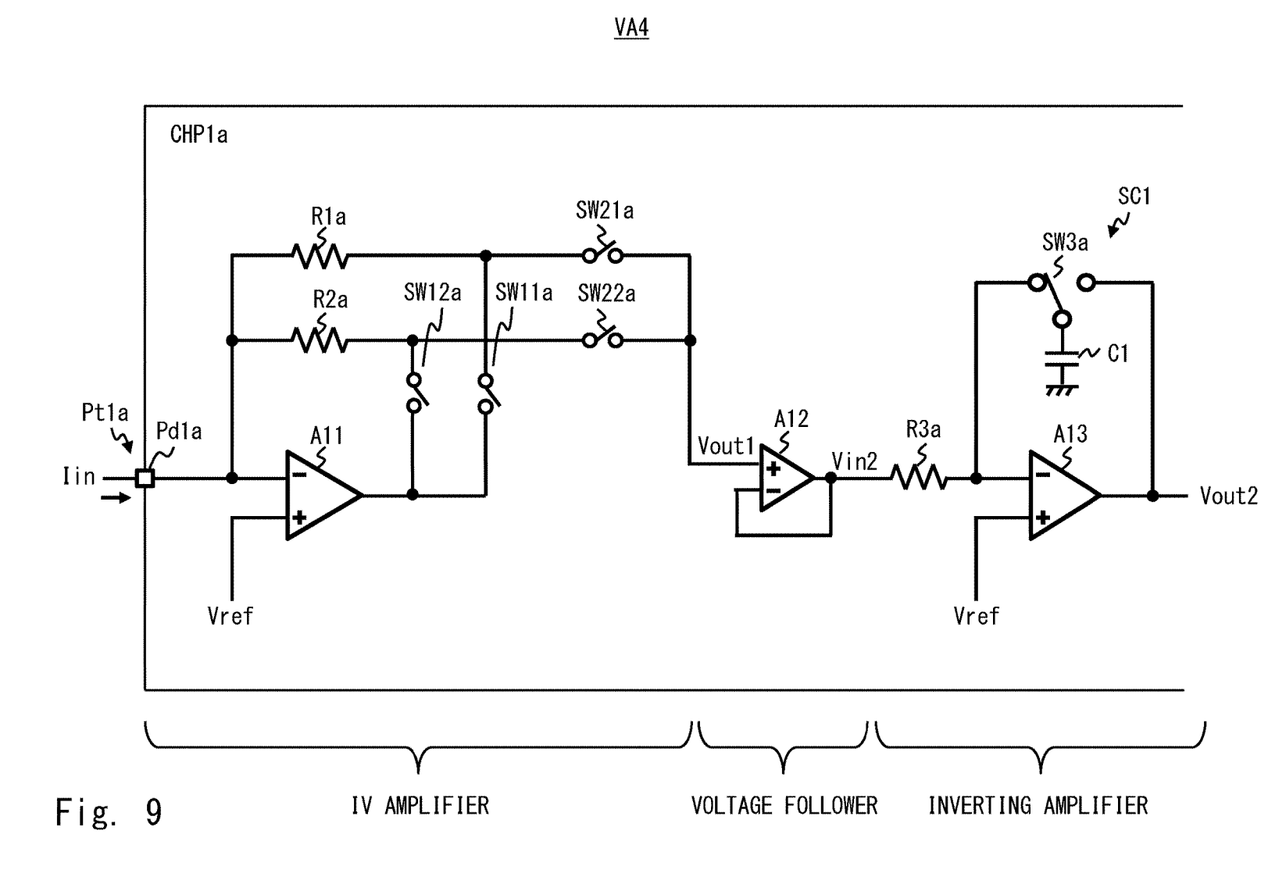
FIG. 9 is a diagram showing a structural example of a variable gain amplifier according to a fourth embodiment.

FIG. 9 is a diagram showing a structural example of a variable gain amplifier VA4 according to a fourth embodiment.

As shown in FIG. 9, the variable gain amplifier VA4 is an amplifier in which a feedback resistor is mounted on a chip, and is provided with, on a chip CHP1a, a port unit Pt1a, operation amplifiers A11 to A13, switches SW11a, SW12a, SW21a, and SW22a, resistive elements R1a, R2a, and R3a, and a switched capacitor SC1 constituted of a switch SW3a and a capacitor C1. The port unit Pt1a includes a pad Pd1a, an ESD protection element (not shown), and a connector (not shown) such as a lead frame and a bonding wire.

It should be noted that the operation amplifier A1l, the switches SW11a, SW12a, SW21a, and SW22a, and the resistive elements R1a and R2a constitute an IV amplifier. The operation amplifier A12 forms a voltage follower. The operation amplifier A13, the resistive element R3a, and the switched capacitor SC1 as the feedback resistor constitute an inverting amplifier.

To an inverting input terminal of the operation amplifier A11, the current Iin is supplied from outside through the pad Pd1a. To a non-inverting input terminal of the operation amplifier A11, the reference voltage Vref is supplied.

Either one of the switches SW11a and SW12a is selectively turned on. As a result, between the inverting input terminal and the output terminal of the operation amplifier A11, the feedback path extending through resistive element R1a or the feedback path extending through resistive element R2a is selectively formed.

Either one of the switches SW21a and SW22a is selectively turned on. Specifically, the switch SW21a is turned on when the switch SW11a is turned on, and the switch SW22a is turned on when the switch SW12a is turned on. As a result, a voltage Vout1 that is generated on the feedback path selectively formed is supplied, as an output voltage of the IV amplifier, to the voltage follower formed by the operation amplifier A12.

It should be noted that, by providing the voltage follower with high input impedance between the IV amplifier and the inverting amplifier, a current does not flow from the IV amplifier to the inverting amplifier. Therefore, without being affected by the resistive elements such as the switches SW21a and SW22a and the like, the output voltage Vout1 of the IV amplifier can be supplied, as the voltage Vin2, to the inverting amplifier.

Then, the inverting amplifier that uses the switched capacitor SC1 as the feedback resistor performs inverting amplification for the voltage Vin2 output from the voltage follower and outputs the voltage as voltage Vout2. It should be noted that a resistance value Rsc of the switched capacitor SC1 can be varied in response to a frequency of a clock supplied.

In this case, because the resistive elements R1a, R2a, and R3a are provided on the chip, resistance values of those may be varied due to unevenness in manufacture or an external factor. It should be noted that the assumption is made that those resistance values vary at approximately the same rate and on approximately the same tendency thanks to devices in a design process and a layout process.

At this time, a differential voltage ΔVout1 between the output voltage Vout1 of the IV amplifier and the reference voltage Vref and a differential voltage ΔVout2 between the output voltage Vout2 of the inverting amplifier and the reference voltage Vref are expressed by the following expressions (3) and (4), respectively.

It should be noted that ΔVin2 represents a differential voltage between the output voltage Vin2 of the voltage follower and the reference voltage Vref, Rsc represents a resistance value of the switched capacitor SC1, Iin represents a current value of the current Iin, R1a represents a resistance value of resistive element R1a, and R3a represents a resistance value of the resistive element R3a. In this example, the case where the switches SW11a and SW21a are on will be described.

$$\Delta Vout1 = -Iin \cdot R1a \quad (3)$$

$$\Delta Vout2 = -(Rsc/R3a) \cdot \Delta Vin2 \quad (4)$$

Because ΔVout1=ΔVin2 is established, the following expression (5) is established.

$$\Delta Vout2 = (R1a/R3a) \cdot Rsc \cdot Iin \quad (5)$$

Here, as described above, the resistance values of the resistive elements R1a and R3a on the chip vary at approximately the same rate and on approximately the same tendency. Therefore, in a resistance ratio R1a/R3a, the amount of variation in the resistance values of the resistive elements R1a and R3a is canceled. Further, the switched capacitor SC1 is unlikely to be affected by the unevenness in manufacture or the like, so it is possible to maintain a desired resistance value with high accuracy. As a result, even in the case where the resistance element is provided on the chip, the variable gain amplifier VA4 can perform the amplification operation with high accuracy without being affected by the unevenness in manufacture or the like.

It should be noted that by changing a clock frequency to change the resistance value of the switched capacitor SC1, the gain of the variable gain amplifier VA4 can be changed, so providing the plurality of feedback paths to the IV amplifier for gain switching is not necessarily required. In the case where one feedback path is provided to the IV amplifier (for example, in the case where only a feedback path extending through the resistive element R1a is provided), the switches (SW11a, SW12a, SW21a, and SW22a) for path switching are not required. As a result, the influence of the resistive component of the switch does not have to be considered, and therefore the voltage follower becomes also unnecessary. In addition, as compared to the structure in which the switched capacitor is used for the resistive element R1a of the IV amplifier, it is possible to suppress the influence of the clock with respect to the current Iin.

As described above, the semiconductor integrated circuit and the variable gain amplifier that uses the semiconductor integrated circuit according to the above embodiments 1 to 4 are provided with the signal lines extended from the pads connected to the resistive elements provided on the feedback paths and outside the chip separately from the feedback paths. As a result, without being affected by the resistive elements such as the ESD protection element provided on the feedback path and in the chip, it is possible to set the gain of the variable gain amplifier with the resistance values of the resistive elements provided on the feedback paths and outside the chip with high accuracy. It should be noted that the resistive elements that determine the gain of the variable gain amplifier are provided outside the chip, so a problem of the unevenness in manufacture due to providing the elements in the chip does not arise.

In the above, the invention made by the inventor of the present invention is described on the basis of the embodiments, but the present invention is not limited to the embodiments described above and can of course be variously changed without departing from the gist thereof.

For example, in the semiconductor device according to the above embodiments, a semiconductor substrate, a semiconductor layer, a diffusion layer (diffusion area), or the like may have an inverted conductivity type (p type or n type). Therefore, in the case where one of the conductivity types of n type and p type is set as a first conductivity type, and the other conductivity type is set as a second conductivity type, the first conductivity type can be set to p type, and the second conductivity type can be set to n type. Conversely, the first conductivity type can be set to n type, and the second conductivity type can be set to p type.

The first to fourth embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor integrated circuit comprising:
    a first pad provided on one end side of a first resistive element and one end side of a second resistive element externally provided;
    a second pad provided on a different end side of the first resistive element;
    a third pad provided on a different end side of the second resistive element and one end side of a third resistive element externally provided;
    an operation amplifier;
    a first signal line wired between an output terminal of the operation amplifier and the first pad;
    a second signal line wired between an inverting input terminal of the operation amplifier and the second pad;
    a third signal line wired between the inverting input terminal of the operational amplifier and the third pad;
    a first ESD (Electrostatic Discharge) protection element provided to the first signal line;

a fourth signal line, through which a voltage signal of the first pad is transmitted, the fourth signal line being connected to the first pad,
a first switch provided on the first signal line;
a second switch provided on the second signal line; and
a third switch provided on the third signal line,
wherein a reference voltage is supplied to a non-inverting input terminal of the operation amplifier.

2. The semiconductor integrated circuit according to claim 1,
wherein an input current is supplied to the second pad and an input voltage is supplied to the third pad.

3. The semiconductor integrated circuit according to claim 1,
wherein at least one of the first switch, the second switch and the third switch is set by a register.

4. A variable gain amplifier comprising:
the first resistive element;
the second resistive element;
the third resistive element; and
the semiconductor integrated circuit according to claim 1.

5. A semiconductor integrated circuit comprising:
a first pad provided on one end side of a first resistive element and one end side of a second resistive element and one end side of a fourth resistive element and one end side of a fifth resistive element externally provided;
a second pad provided on a different end side of the first resistive element;
a third pad provided on a different end side of the second resistive element and one end side of a third resistive element externally provided;
a fourth pad provided on a different end side of the fourth resistive element;
a fifth pad provided on a different end side of the fifth resistive element and one end side of a sixth resistive element externally provided;
an operation amplifier;
a first signal line wired between an output terminal of the operation amplifier and the first pad;
a second signal line wired between an inverting input terminal of the operation amplifier and the second pad;
a third signal line wired between the inverting input terminal of the operational amplifier and the third pad;
a fifth signal line wired between the inverting input terminal of the operational amplifier and the fourth pad;
a sixth signal line wired between the inverting input terminal of the operational amplifier and the fifth pad;
a first ESD (Electrostatic Discharge) protection element provided to the first signal line;
a fourth signal line, through which a voltage signal of the first pad is transmitted, the fourth signal line being connected to the first pad,
a first switch provided on the first signal line;
a second switch provided on the second signal line;
a third switch provided on the third signal line;
a fourth switch provided on the fifth signal line; and
a fifth switch provided on the sixth signal line,
wherein a reference voltage is supplied to a non-inverting input terminal of the operation amplifier.

6. The semiconductor integrated circuit according to claim 5,
wherein a first input current is supplied to the second pad and a second input current is supplied to the fourth pad and a first input voltage is supplied to the third pad and a second input voltage is supplied to the fifth pad.

7. The semiconductor integrated circuit according to claim 5,
at least one of the first switch, the second switch, the third switch, the fourth switch, the fifth switch is set by a register.

8. A variable gain amplifier comprising:
the first resistive element;
the second resistive element;
the third resistive element;
the fourth resistive element;
the fifth resistive element;
the sixth resistive element; and
the semiconductor integrated circuit according to claim 5.

* * * * *